(12) United States Patent
Fujita et al.

(10) Patent No.: US 8,476,361 B2
(45) Date of Patent: Jul. 2, 2013

(54) FINE PATTERN TRANSFER MATERIAL

(75) Inventors: Toshio Fujita, Tokyo (JP); Hiroshi Uchida, Tokyo (JP); Katsutoshi Morinaka, Tokyo (JP); Katsumasa Hirose, Ichihara (JP)

(73) Assignee: Showa Denko K.K., Tokyo (JP)

( * ) Notice: Subject to any disclaimer, the term of this patent is extended or adjusted under 35 U.S.C. 154(b) by 401 days.

(21) Appl. No.: 12/523,464

(22) PCT Filed: Feb. 7, 2008

(86) PCT No.: PCT/JP2008/052476
§ 371 (c)(1),
(2), (4) Date: Jul. 16, 2009

(87) PCT Pub. No.: WO2008/099903
PCT Pub. Date: Aug. 21, 2008

(65) Prior Publication Data
US 2010/0093907 A1  Apr. 15, 2010

(30) Foreign Application Priority Data

Feb. 9, 2007 (JP) .................................. 2007-030805

(51) Int. Cl.
*C08L 83/04* (2006.01)
(52) U.S. Cl.
USPC ........................................................ 524/588
(58) Field of Classification Search
USPC ........................................................ 524/588
See application file for complete search history.

(56) References Cited

U.S. PATENT DOCUMENTS 6,565,763 B1 * 5/2003 Asakawa et al. ................ 216/56
2006/0280861 A1  12/2006 Shirotori et al.

FOREIGN PATENT DOCUMENTS

| JP | 6-114334 A | 4/1994 |
| JP | 2002088157 A | 3/2002 |
| JP | 2002088245 A | 3/2002 |
| JP | 2003-100609 A | 4/2003 |
| JP | 2006-110956 A | 4/2006 |
| JP | 2006-168147 A | 6/2006 |
| JP | 2006-285017 A | 10/2006 |

OTHER PUBLICATIONS

Yutaka Igaku, et al., Room Temperature Nanoimprint Technology Using Hydrogen Silsequioxane (HSQ), Japanese Journal of Applied Physics, Jun. 2002, pp. 4198-4202, vol. 41, No. 6B.
Matsui S, et al., "Room-temperature nanoimprint and nanotransfer printing using hydrogen silsequioxane", Journal of Vacuum Science & Technology B: Microelectronicsprocessing and Phenomena, American Vacuum Society, Mar. 2003, pp. 688-692, vol. 21, No. 2.
Chen Sun, et al., "Study of nanoimprint pattern transfer on hydrogen silsesquioxane", Journal of Vacuum Science and Technology: Part B, AVS / AIP, Jul. 2006, pp. 1934-1940, vol. 24, No. 4.

* cited by examiner

*Primary Examiner* — Kuo-Liang Peng
(74) *Attorney, Agent, or Firm* — Sughrue Mion, PLLC

(57) ABSTRACT

A transfer material that can favorably form a fine pattern by nanoimprinting. The nanoimprinting transfer material is a fine pattern resin composition that includes an organosilicon compound and a metal compound of a metal from groups 3 through 14 of the periodic table.

10 Claims, 2 Drawing Sheets

FINE PATTERN TRANSFER MATERIAL

TECHNICAL FIELD

The present invention relates to a fine pattern transfer material that is suited for use in semiconductor manufacturing processes and patterned media manufacturing processes using a perpendicular magnetic recording method.

BACKGROUND ART

The industry demands the development of nanoimprinting technology, in particular transfer materials, for nanoimprinting a fine pattern required in semiconductor manufacturing processes or patterned media manufacturing processes using a perpendicular magnetic recording method.

In the past, technology has been disclosed for nanoimprinting a fine pattern on a substrate at room temperature by forming a coating film of poly-hydrogenated silsesquioxane on the substrate, prebaking the coated surface at a temperature of 150° C. or less, and then pressing the film with a mold. (Refer to patent document 1 and non-patent documents 1, 2, and 3.) Furthermore, similar technology using cage polysilsesquioxane has also been disclosed (refer to patent document 2). This technology is not only used for semiconductor manufacturing processes, but is also starting to be applied to the production of magnetic recording media such as discrete track media and patterned media (refer to patent document 3). However, the polymers that have been used to date have low thermal resistance, and there is a problem that the pattern shape cannot be maintained depending on the environment to which the pattern formed is exposed.

In order to overcome these problems, technology has been disclosed where a fine pattern is formed using a polyimide resin with high thermal resistance (refer to patent document 4). However, there have been problems with formability, such as where the top region of a rectangle is transferred as a recess.

[Patent Document 1] Japanese Unexamined Patent Application 2003-100609
[Patent Document 2] Japanese Unexamined Patent Application 2006-285017
[Patent Document 3] Japanese Unexamined Patent Application 2006-302396
[Patent Document 4] Japanese Unexamined Patent Application 2006-110956
[Non-patent document 1] Y. Igaku et al., Jpn. J. Appli. Phys., 41, 4198 (2002)
[Non-patent document 2] S. Matsui et al., J. Vac. Sci. Technol. B, 21, 688 (2003)
[Non-patent document 3] S. Z. Chen et al., J. Vac. Sci. Technol. B, 24, 1934 (2006)

DISCLOSURE OF THE INVENTION

An objective of the present invention is to provide a transfer material that can favorably form a fine pattern by nanoimprinting.

As a result of diligent research concerning these issues, the present inventors have discovered that a resin composition prepared by blending an organosilicon compound with a metal compound is a fine pattern transfer material with increased thermal resistance which can achieve the objective of the present invention. In other words, the present invention is directed to the following items:

[1] A transparent fine pattern transfer material used for nanoimprinting, comprising an organosilicon compound and a metal compound of a metal from groups 3 through 14 of the periodic table, wherein said metal compound is expressed by the following Formula (1):

$$M(OR)_n \qquad (1)$$

where M represents a metal element belonging to group 3 through group 14 in the periodic table, R represents an alkyl group with between 1 and 6 carbon atoms or a phenyl group, and n represents an integer between 1 and 5.

[2] The transparent fine pattern transfer material according to [1], wherein said organosilicon compound is a polysilsesquioxane compound.

[3] The transparent fine pattern transfer material according to [1], wherein M in Formula (1) represents Nb, Ti, Ta, Sb, or Hf, and R is a methyl group, ethyl group, propyl group, isopropyl group, n-butyl group, sec-butyl group, or tert-butyl group.

[4] The transparent fine pattern transfer material according to [1], wherein said organosilicon compound is polyphenylsilsesquioxane or polystyryl silsesquioxane, and said metal compound is tetraethoxytitanium, pentaethoxytantalum, penta(n-butoxy)tantalum, or pentaethoxytungsten.

[5] The transparent fine pattern transfer material according to [1], wherein the weight of the metal alkoxide that is converted to the weight of a corresponding metal oxide is between 5 and 200 weight parts, based on 100 weight parts of polysilsesquioxane.

The fine pattern transfer material of the present invention has excellent thermal resistance, and can suitably form a fine pattern that is required in semiconductor manufacturing processes or patterned media manufacturing processes using a perpendicular magnetic recording method.

BEST MODE FOR CARRYING OUT THE INVENTION

Figure 1:
FIG. 1 is a photograph showing a fine pattern that is formed in a fine pattern transfer material (a) of Example 1.

The fine pattern transfer material of the present invention is described below in detail.
Transfer Material
The fine pattern transfer material of the present invention contains an organosilicon compound and a metal compound. A fine pattern is transferred by pressing a mold having a fine pattern engraved thereon against the transfer material of the present invention which has been applied to a substrate.
Organosilicon Compound
The organosilicon compound may be a silicon resin or a polysilsesquioxane compound, but the use of polysilsesquioxane is particularly preferable. Here, the term "polysilsesquioxane" refers to a network polymer or polyhedral cluster that has a siloxane bond in the main chain, and hydrogen atoms or organic groups as side chains, and is obtained by hydrolysis of a trifunctional silane compound.

Specific examples of polysilsesquioxane include poly-hydrogenated silsesquioxane, polymethylsilsesquioxane, polyethylsilsesquioxane, polypropylsilsesquioxane, polyisopropylsilsesquioxane, polybutylsilsesquioxane, poly(sec-butyl) silsesquioxane, poly(tert-butyl)silsesquioxane, polyphenylsilsesquioxane, polynaphthylsilsesquioxane, polystyryl silsesquioxane, and polyadamantylsilsesquioxane and the like. Of these, poly-hydrogenated silsesquioxane, polymethylsilsesquioxane, polyethylsilsesquioxane, poly(tert-butyl)silsesquioxane, polyphenylsilsesquioxane, and polystyryl silsesquioxane are preferable, and polyphenylsilsesquioxane and polystyryl silsesquioxane are particularly preferable.

The polysilsesquioxane can be manufactured by a commonly known method such as the methods shown in Japanese Unexamined Patent Application 2002-88157 and Japanese Unexamined Patent Application 2002-88245, and for example, the material made commercially available by Konishi Chemical Ind. Co., Ltd. can be used.

Metal Compound

The metal compound may be a metal alkoxide compound expressed by the general formula:

$M(OR)_n$ where M represents a metal element belonging to group 3 through group 14 in the periodic table, R represents a phenyl group or an alkyl group with between 1 and 6 carbon atoms, and n represents an integer between 1 and 5. Herein, the term "metal element" refers to any of the elements from Groups 3 through 13, and germanium and tin from Group 14. Furthermore, the term "periodic table" refers to the periodic table according to the IUPAC Inorganic Chemical Nomenclature, revised edition (1989).

Examples of the metal compound include trimethoxyaluminum, triethoxyaluminum, tri(n-propoxy)aluminum, triisopropoxyaluminum, tri(n-butoxy)aluminum, triisobutoxyaluminum, tri(sec-butoxy)aluminum, tri(tert-butoxy)aluminum, diisopropoxycobalt, triisopropoxydysprosium, triisopropoxyerbium, triisopropoxyeuropium, triethoxyiron, triisopropoxyiron, trimethoxygallium, triisopropoxygallium, tri(n-propoxy)gallium, tri(n-propoxy)gadolinium, tetramethoxygermanium, tetraethoxygermanium, tetraisopropoxygermanium, tetra(n-propoxy)germanium, tetra(isobutoxy)germanium, tetra(n-butoxy)germanium, tetra(sec-butoxy)germanium, tetra(tert-butoxy)germanium, tetramethoxyhafnium, tetraethoxyhafnium, tetraisopropoxyhafnium, tetra(tert-butoxy)hafnium, triisopropoxyindium, triethoxylanthanum, triisopropoxylanthanum, di(n-butoxy) manganese, pentaethoxymolybdenum, pentamethoxyniobium, pentaethoxyniobium, pentaisopropoxyniobium, penta(n-propoxy)niobium, pentaisobutoxyniobium, penta(n-butoxy)niobium, penta(sec-butoxy)niobium, triisopropoxyneodymium, triisopropoxypraseodymium, triisobutoxyantimony, tri(n-butoxy)antimony, triisopropoxyscandium, triisopropoxysamarium, tetraethoxytin, tetraisopropoxytin, tetra(n-butoxy)tin, pentamethoxytantalum, pentaethoxytantalum, pentaisopropoxytantalum, penta(n-propoxy)tantalum, pentaisobutoxytantalum, penta(n-butoxy)tantalum, penta(sec-butoxy)tantalum, penta(tert-butoxy)tantalum, tetramethoxytitanium, tetraethoxytitanium, tetraisopropoxytitanium, tetra(n-propoxy)titanium, tetraisobutoxytitanium, tetra(n-butoxy)titanium, tetra(sec-butoxy)titanium, tetra(tert-butoxy)titanium, pentaethoxytungsten, pentaisopropoxytungsten, triethoxyyttrium, triisopropoxyyttrium, triisopropoxyytterbium, diethoxyzinc, tetramethoxyzirconium, tetraethoxyzirconium, tetraisopropoxyzirconium, tetra(n-propoxy)zirconium, tetraisobutoxyzirconium, tetra(n-butoxy)zirconium and tetra(sec-butoxy)zirconium, and tetra(tert-butoxy)zirconium. Of these, tetramethoxygermanium, tetraethoxygermanium, tetraisopropoxygermanium, tetra(n-propoxy)germanium, tetraisobutoxygermanium, tetra(n-butoxy)germanium, tetra(sec-butoxy)germanium, tetra(tert-butoxy)germanium, tetra(tert-butoxy)hafnium, pentaethoxymolybdenum, pentaethoxyniobium, penta(n-propoxy)niobium, penta(n-butoxy) niobium, penta(sec-butoxy)niobium, pentamethoxytantalum, pentaethoxytantalum, pentaisopropoxytantalum, penta(n-propoxy)tantalum, pentaisobutoxytantalum, penta(n-butoxy)tantalum, penta(sec-butoxy)tantalum, penta(tert-butoxy)tantalum, tetramethoxytitanium, tetraethoxytitanium, tetraisopropoxytitanium, tetra(n-propoxy)titanium, tetraisobutoxytitanium, tetra(n-butoxy)titanium, tetra(sec-butoxy)titanium, tetra(tert-butoxy)titanium, pentaethoxytungsten and pentaisopropoxytungsten are preferable, and tetra(tert-butoxy)hafnium, pentaethoxyniobium, penta(n-propoxy)niobium, penta(n-butoxy)niobium, penta(sec-butoxy)niobium, pentamethoxytantalum, pentaethoxytantalum, pentaisopropoxytantalum, penta(n-propoxy)tantalum, pentaisobutoxytantalum, penta(n-butoxy)tantalum, penta(sec-butoxy)tantalum, penta(tert-butoxy)tantalum, tetramethoxytitanium, tetraethoxytitanium, tetraisopropoxytitanium, tetra(n-propoxy)titanium, tetraisobutoxytitanium, tetra(n-butoxy)titanium, tetra(sec-butoxy)titanium, tetra(tert-butoxy)titanium, pentaethoxytungsten and pentaisopropoxytungsten are particularly preferable.

Manufacturing Method

The fine pattern transfer material of the present invention is a resin composition that contains polysilsesquioxane and a metal alkoxide. The resin composition can be prepared by directly mixing the both components, or by first preparing respective solutions of the polysilsesquioxane and metal alkoxide, and then mixing the solutions.

Specific examples of the solvent include:

aromatic hydrocarbons such as benzene, toluene, and xylene;

halogenated hydrocarbons such as methylene chloride and chloroform;

ethers such as tetrahydrofuran, diethyl ether, and diethylene glycol dimethyl ether;

ketones such as acetone, methyl ethyl ketone, 3,5,5-trimethyl-2-cyclohexene-1-one, and methyl isobutyl ketone;

esters such as methyl acetate, ethyl acetate, isopropyl acetate, n-propyl acetate, butyl acetate, ethylene glycol monomethyl ether acetate, propylene glycol monomethyl ether acetate, ethylene glycol monoethyl ether acetate, 3-methoxybutyl acetate, ethylene glycol monobutyl ether acetate, diethylene glycol monoethyl ether acetate, and diethylene glycol monobutyl ether acetate and the like;

polar organic solvents such as dimethyl sulfoxide and N-methylpyrrolidone and the like;

alcohols such as methanol, ethanol, and isopropanol;

and ether alcohols such as propylene glycol monomethyl ether, ethylene glycol monoethyl ether, 3-methoxybutanol, diethylene glycol monoethyl ether, and diethylene glycol monobutyl ether and the like. The solvents can be used individually, or two or more kinds may be used in combination.

In the fine pattern transfer material of the present invention, the weight of the metal alkoxide that is converted to the weight of a corresponding metal oxide is preferably between 0.1 and 300 weight parts, more preferably between 5 and 200 weight parts, and particularly preferably between 10 and 100 weight parts, based on 100 weight parts of polysilsesquioxane.

This range is preferable because the fine pattern that is formed will be stable.

Substrate

The substrate to which the fine pattern transfer material is applied may be a silicon substrate, an aluminum substrate, a glass substrate, a substrate with a metal layer or a carbon layer formed by a sputtering method or the like, a hard disk medium made of a glass substrate, a polyamide resin film, a polyimide resin film, a polyethylene terephthalate resin film, a polyethylene naphthalate resin film, or a silicone resin film.

Application

The application of the fine pattern transfer material onto the substrate can be performed in a standard atmosphere, or can be performed in an inert gas environment such as nitrogen gas, helium gas, or argon gas or the like. The application can be performed within a temperature range between −10° C. and 200° C.

The application of the fine pattern transfer material to the substrate can be performed under sunlight or can be performed under fluorescent lighting or under UV cut fluorescent lighting.

The fine pattern transfer material may be applied to the substrate by a method of printing the transfer material to the substrate using a printer such as an ink-jet printer, a method of directly dropping or spraying the transfer material onto the substrate, or a method of forming a uniform film of the transfer material on the entire surface of the substrate by immersing the substrate in the transfer material solution and then allowing the coated substrate to stand, or immersing and then rotating the substrate at a rotational speed between 100 rpm and 10,000 rpm, preferably between 100 rpm and 6000 rpm. The rotational speed may be arbitrary and may be changed in steps. Furthermore, the transfer material can be applied to both surfaces of the substrate, or can be applied to only one surface, depending on the need.

The film thickness can be any thickness between 0.01 nm and 10 μm, depending on the shape of the stamper that is used for the nanoimprinting. An optimal film thickness can be determined by evaluating the conditions of the application step, or can be determined using a simulation method such as a finite element analysis method for the transfer material behavior during the nanoimprinting. Herein, the term "nanoimprinting" refers to the technology where a mold engraved with ridges and grooves which have a line width between several tens of nanometers and several hundreds of nanometers is pressed against a resin material that has been applied to a substrate, and the pattern of the mold is transferred on the resin material.

After the transfer material has been applied, the substrate can be immediately subjected to the step of forming the fine pattern by nanoimprinting, or if necessary can be dried and pretreated by being left in a vacuum or a gas stream such as air, oxygen gas, hydrogen gas, nitrogen gas, a halogen gas, a halogenated hydrocarbon gas, a hydrocarbon gas, an aromatic organic compound gas, helium gas, or argon gas or the like, and can then be subjected to the step of forming the fine pattern by nanoimprinting. At this time, the temperature may be in the range of between −10° C. and 300° C.

Manufacturing the Fine Pattern

The fine pattern may be formed by nanoimprinting in an ambient environment, or under a vacuum, or under an inert gas environment such as nitrogen gas, helium gas, or argon gas. At this time, the temperature may be in the range of between −10° C. and 300° C. The nanoimprinting of the fine pattern can be performed under sunlight, or can be performed under fluorescent lighting, or under fluorescent lighting with the ultraviolet wavelengths removed.

The line width of the fine pattern that is formed by nanoimprinting is 10 μm or less.

After the fine pattern has been formed by nanoimprinting, the substrate can be subjected to the next step, or if necessary can be dried and pretreated by being left under a low-pressure mercury lamp, a high-pressure mercury lamp, or an ultraviolet LED, in a vacuum or a gas stream such as air, oxygen gas, hydrogen gas, nitrogen gas, a halogen gas, a halogenated hydrocarbon gas, a hydrocarbon gas, an aromatic organic compound gas, helium gas, or argon gas or the like, and can then be subjected to the next step. At this time, the temperature may be in the range of between −10° C. and 300° C.

The material of the mold that is used for manufacturing the fine pattern can be tantalum, nickel, tungsten, silicon, or glass. The pressure at which the mold is pressed to the transfer material that has been applied to the substrate is between 50 MPa and 250 MPa, and preferably between 100 MPa and 200 MPa.

EXAMPLES

The present invention will be described below using examples, but the present invention is not restricted to these examples.

Example 1

Figure 2:
FIG. 2 is a photograph taken after heating the fine pattern that is formed in the fine pattern transfer material (a) of Example 1.

Polyphenylsilsesquioxane (product name: PPSQ-T, Konishi Chemical Ind. Co., Ltd.) weighing 0.5 g was dissolved in 9.5 g of propylene glycol monomethyl ether acetate. Pentaethoxytantalum weighing 0.32 g was added dropwise into 5 g of this solution in a nitrogen box at room temperature, and then the container was shaken to mix the components. After the container had sat in the nitrogen box for 48 hours, the colorless clear solution that was obtained was filtered using a 0.2 μm micropore filter to obtain a solution of a resin composition (hereinafter referred to as "fine pattern transfer material (a)"). 0.5 mL of this solution was dropped onto a hard disk medium made of glass which had been set in a spin coater. The hard disk medium was rotated at 500 rpm for 10 seconds, and then at 3000 rpm for 2 seconds, and finally at 5000 rpm for 20 seconds, thus forming a thin film of the fine pattern transfer material (a) on one surface of the hard disk medium. A fine pattern was formed in the fine pattern transfer material (a) on the hard disk medium by pressing the thin film against a nickel mold (at 118 MPa) using a press. When the hard disk medium was broken and the cross-section was observed using a field emission scanning electron microscope, it was determined that the fine pattern was formed in the fine pattern transfer material (a) as shown in FIG. 1. Furthermore, the hard disk medium on which the fine pattern was formed in the fine pattern transfer material (a) was heated for one hour at 250° C., and then the cross-section was observed. It was determined that the fine pattern that had been formed had remained without changes as shown in FIG. 2.

Note, the mold used above had a line width of 120 nm and a space width of 60 nm. The term "line width" refers to the line width of the ridges that are transferred, and the term "space width" refers to the line width of the grooves that are transferred.

Example 2

Figure 3:
FIG. 3 is a photograph showing a heat-treated fine pattern that is formed in the fine pattern transfer material (a) of Example 2.
Figure 4:
FIG. 4 is a photograph taken after further heating the heat-treated fine pattern that is formed in the fine pattern transfer material (a) of Example 2.

Using the same method as Example 1, a thin film of the fine pattern transfer material (a) was formed on a hard disk medium. After the hard disk medium was heated for 1 hour at 160° C., a fine pattern was formed in the fine pattern transfer material (a) on the hard disk medium by pressing (at 118 MPa) the thin film against the nickel mold using a press at room temperature. When the hard disk medium was broken and the cross-section was observed, it was determined that the fine pattern was formed as shown in FIG. 3. Furthermore, the hard disk medium on which the fine pattern was formed in the fine pattern transfer material (a) was further heated for one hour at 250° C., and then the cross-section was observed. It was determined that the fine pattern that had been formed had remained without changes even after the high-temperature heat treatment as shown in FIG. 4.

Example 3

A solution of fine pattern transfer material (b) was prepared in a similar manner to Example 1 and Example 2, with the exception that 0.14 g of pentaethoxytantalum was used, and then a fine pattern was formed and observed. The results are shown in Table 1.

Example 4

A solution of fine pattern transfer material (c) was prepared in a similar manner to Example 1 and Example 2, with the exception that 0.23 g of pentaethoxytantalum was used, and then a fine pattern was formed and observed. The results are shown in Table 1.

Example 5

A solution of fine pattern transfer material (d) was prepared in a similar manner to Example 1 and Example 2, with the exception that 0.46 g of pentaethoxytantalum was used, and then a fine pattern was formed and observed. The results are shown in Table 1.

Example 6

A solution of fine pattern transfer material (e) was prepared in a similar manner to Example 1 and Example 2, with the exception that 0.12 g of penta(n-butoxy) tantalum was used, and then a fine pattern was formed and observed. The results are shown in Table 1.

Example 7

A solution of fine pattern transfer material (f) was prepared in a similar manner to Example 1 and Example 2, with the exception that 0.09 g of pentaethoxytungsten was used, and then a fine pattern was formed and observed. The results are shown in Table 1.

Example 8

A solution of fine pattern transfer material (g) was prepared in a similar manner to Example 1 and Example 2, with the exception that 0.15 g of pentaethoxytungsten was used, and then a fine pattern was formed and observed. The results are shown in Table 1.

Example 9

A solution of fine pattern transfer material (h) was prepared in a similar manner to Example 1 and Example 2, with the exception that 0.20 g of pentaethoxytungsten was used, and then a fine pattern was formed and observed. The results are shown in Table 1.

Comparative Example 1

Polyphenylsilsesquioxane (product name: PPSQ-T, Konishi Chemical Ind. Co., Ltd.) weighing 0.5 g was dissolved in 9.5 g of propylene glycol monomethyl ether acetate. 0.5 mL of this solution (hereinafter referred to as "fine pattern transfer material (i)") was dropped onto a hard disk medium made of glass which had been set in a spin coater. The hard disk medium was rotated at 500 rpm for 10 seconds, and then at 3000 rpm for 2 seconds, and finally at 5000 rpm for 20 seconds, thus forming a thin film of the resin composition (i) on one surface of the hard disk medium. A fine pattern was formed in the fine pattern transfer material (i) on the hard disk medium by pressing the thin film against the nickel mold (at 118 MPa) using a press. When the hard disk medium was broken and the cross-section was observed using a field emission scanning electron microscope, it was determined that the fine pattern was formed in the fine pattern transfer material (i). However, when the cross-section was observed after heating for 1 hour at 250° C., it was determined that the fine pattern that had been formed had collapsed in the heat treatment. The results are shown in Table 1.

Comparative Example 2

Similar to Comparative Example 1, a thin film of the fine pattern transfer material (i) was formed on a hard disk medium. The hard disk medium was then heated at 160° C. for 1 hour, and then a fine pattern was formed on the hard disk medium by pressing the thin film against the nickel mold (at 118 MPa) using a press at room temperature. When the cross-section was observed using a field emission scanning electron microscope, it was determined that the fine pattern had formed. However, when the cross-section was similarly observed after heating for 1 hour at 250° C., it was determined that the fine pattern that had been formed had collapsed in the heat treatment. The results are shown in Table 1.

TABLE 1

| | | Fine Pattern Observation Results | | | |
| | | No Preliminary Heating of Thin Film | | Preliminary Heating of Thin Film 160° C. × 1 hour | |
| | Fine Pattern Transfer Material | No heating after forming fine pattern | Heating after forming fine pattern (250° C. × 1 hour) | No heating after forming fine pattern | Heating after forming fine pattern (250° C. × 1 hour) |
|---|---|---|---|---|---|
| Example 3 | (b) | ○ | ○ | ○ | ○ |
| Example 4 | (c) | ○ | ○ | ○ | ○ |
| Example 5 | (d) | ○ | ○ | ○ | ○ |
| Example 6 | (e) | ○ | ○ | ○ | ○ |
| Example 7 | (f) | ○ | ○ | ○ | ○ |
| Example 8 | (g) | ○ | ○ | ○ | ○ |
| Example 9 | (h) | ○ | ○ | ○ | ○ |

TABLE 1-continued

| | Fine Pattern Transfer Material | Fine Pattern Observation Results | | | |
|---|---|---|---|---|---|
| | | No Preliminary Heating of Thin Film | | Preliminary Heating of Thin Film 160° C. × 1 hour | |
| | | No heating after forming fine pattern | Heating after forming fine pattern (250° C. × 1 hour) | No heating after forming fine pattern | Heating after forming fine pattern (250° C. × 1 hour) |
| Comparative Example 1 | (i) | ○ | X | — | — |
| Comparative Example 2 | (j) | — | — | ○ | X |

○ The fine pattern remained.
X The fine pattern which had been formed collapsed.

INDUSTRIAL APPLICABILITY

The fine pattern transfer material of the present invention has dramatically improved thermal resistance, and can stably maintain a fine pattern shape on a substrate that has been nanoimprinted, and therefore can be used in a wide range of semiconductor manufacturing processes and patterned media manufacturing processes that use a perpendicular magnetic recording method.

The invention claimed is:

1. A colorless, clear fine pattern transfer material used for nanoimprinting, comprising a base resin and a metal compound of a metal from groups 3 through 14 of the periodic table,
   wherein said base resin consists essentially of an organosilicon compound, and
   wherein said metal compound is expressed by the following Formula (1);

$$M(OR)_n \qquad (1)$$

where M represents a metal element belonging to group 3 through group 14 in the periodic table, R represents an alkyl group with between 1 and 6 carbon atoms or a phenyl group, and n represents an integer between 1 and 5.

2. The colorless, clear fine pattern transfer material according to claim 1, wherein said organosilicon compound is a polysilsesquioxane compound.

3. The colorless, clear fine pattern transfer material according to claim 2, wherein the weight of the metal alkoxide that is converted to the weight of a corresponding metal oxide is between 5 and 200 weight parts, based on 100 weight parts of polysilsesquioxane.

4. A method for forming a fine pattern transfer material, comprising the steps of:
   applying the colorless, clear fine pattern transfer material as claimed in claim 3 to a substrate to form a thin film; and
   pressing a mold engraved with ridges and grooves which have a line width of 10 μm or less against the thin film formed on the substrate to transfer the pattern of the mold on the thin film.

5. A method for forming a fine pattern transfer material, comprising the steps of:
   applying the colorless, clear fine pattern transfer material as claimed in claim 2 to a substrate to form a thin film; and
   pressing a mold engraved with ridges and grooves which have a line width of 10 μm or less against the thin film formed on the substrate to transfer the pattern of the mold on the thin film.

6. The colorless, clear fine pattern transfer material according to claim 1, wherein M in Formula (1) represents Nb, Ti, Ta, Hf, or W, and R is a methyl group, ethyl group, propyl group, isopropyl group, n-butyl group, sec-butyl group, or tert-butyl group.

7. A method for forming a fine pattern transfer material, comprising the steps of:
   applying the colorless, clear fine pattern transfer material as claimed in claim 6 to a substrate to form a thin film; and
   pressing a mold engraved with ridges and grooves which have a line width of 10 μm or less against the thin film formed on the substrate to transfer the pattern of the mold on the thin film.

8. The colorless, clear fine pattern transfer material according to claim 1, wherein said organosilicon compound is polyphenylsilsesquioxane or polystyryl silsesquioxane, and said metal compound is tetraethoxytitanium, pentaethoxytantalum, penta(n-butoxy)tantalum, or pentaethoxytungsten.

9. A method for forming a fine pattern transfer material, comprising the steps of:
   applying the colorless, clear fine pattern transfer material as claimed in claim 8 to a substrate to form a thin film; and
   pressing a mold engraved with ridges and grooves which have a line width of 10 μm or less against the thin film formed on the substrate to transfer the pattern of the mold on the thin film.

10. A method for forming a fine pattern transfer material, comprising the steps of:
    applying the colorless, clear fine pattern transfer material as claimed in claim 1 to a substrate to form a thin film; and
    pressing a mold engraved with ridges and grooves which have a line width of 10 μm or less against the thin film formed on the substrate to transfer the pattern of the mold on the thin film.

* * * * *